United States Patent [19]
Lee

[11] Patent Number: 6,083,787
[45] Date of Patent: Jul. 4, 2000

[54] METHOD OF FABRICATING DEEP TRENCH CAPACITORS FOR DRAM CELLS

[75] Inventor: Chiu-Te Lee, Hsinchu, Taiwan

[73] Assignees: ProMos Technology, Inc.; Mosel Vitelic Inc., both of Hsinchu, Taiwan; Siemens AG, Munich, Germany

[21] Appl. No.: 09/175,868

[22] Filed: Oct. 19, 1998

[51] Int. Cl.⁷ ................................. H01L 21/8242
[52] U.S. Cl. ........................... 438/243; 438/386
[58] Field of Search ................... 438/243, 244, 438/248, 387, 386, 246, 389, FOR 212

[56] References Cited

U.S. PATENT DOCUMENTS 5,780,332  7/1998  Ozaki .

*Primary Examiner*—George Fourson
*Assistant Examiner*—Elizabeth Abbott
*Attorney, Agent, or Firm*—W. Wayne Liauh

[57] ABSTRACT

A method of fabricating deep trench capacitors of high density Dynamic Random Access Memory (DRAM) cells is disclosed: first, deep trenches are formed on a silicon substrate by using oxide and nitride as etching masks, then, an ONO capacitor dielectric layer is deposited inside the trench, a first polysilicon layer as storage node is then deposited to fill the bottom of the trench, thereafter, dielectric collars are formed on the sidewalls of the trench, next, a sacrificial stud is formed inside the trench, the dielectric collars are then recessed to expose the contact area for the trench capacitor and access transistor, next, the sacrificial stud is removed by wet etching, followed by a second polysilicon deposition overlaying the first polysilicon, finally, the second polysilicon layer is etchback to a height slightly lower than the substrate surface to complete the trench capacitor formation.

14 Claims, 6 Drawing Sheets

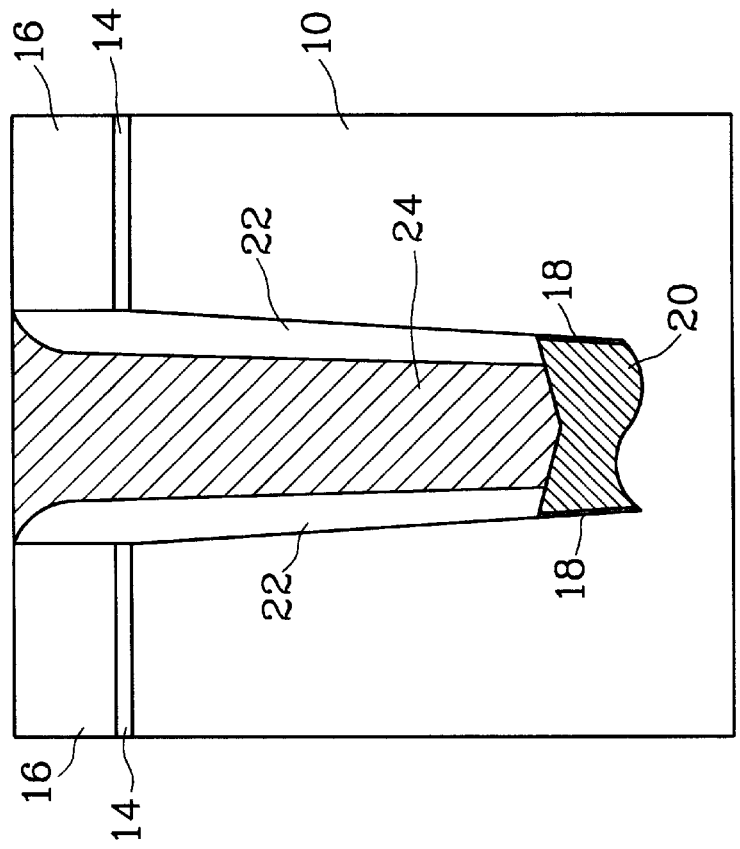
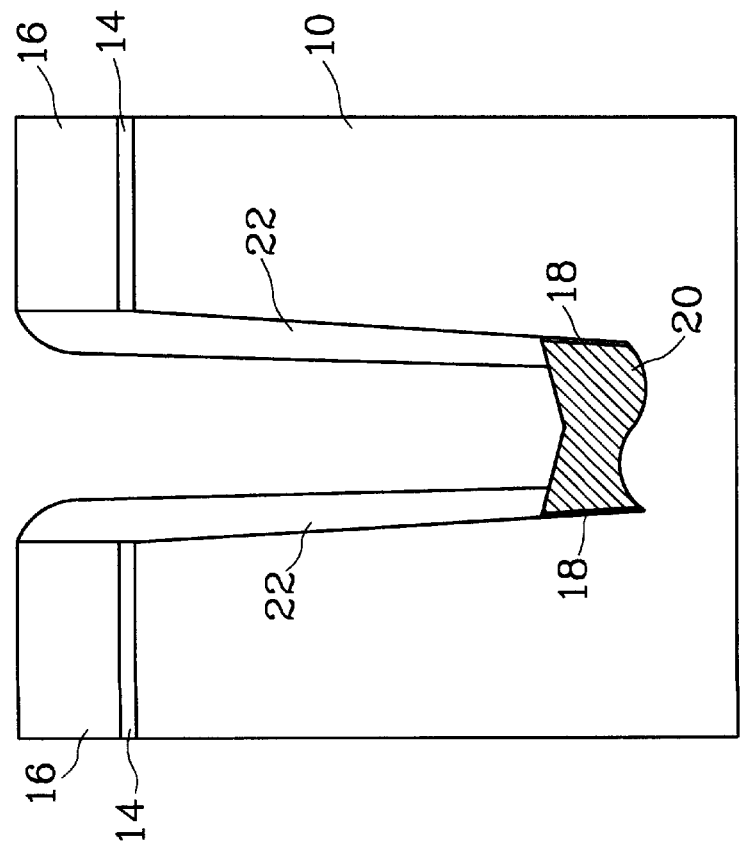

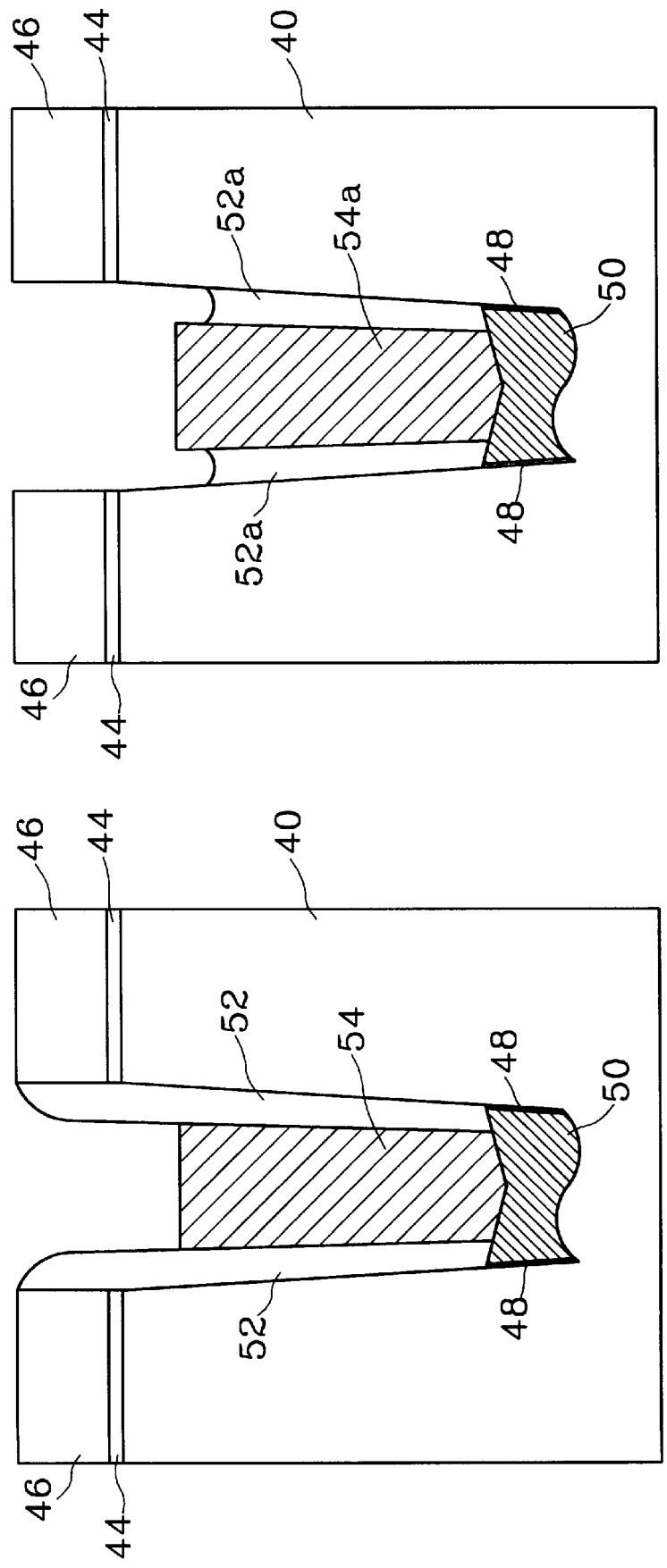

METHOD OF FABRICATING DEEP TRENCH CAPACITORS FOR DRAM CELLS

BACKGROUND OF THE INVENTION (1) Field of the invention

The present invention relates to a method of fabricating trench capacitor cell having a buried strap, and more particularly to a process for fabricating a trench capacitor cell with less polysilicon deposition and polishing steps.

(2) Description of the related art

A DRAM cell comprises a metal-oxide-semiconductor field effect transistor (MOSFET) and a capacitor which are built in a semiconductor silicon substrate. There is an electrical contact between the source of a MOSFET and the storage node of the adjacent capacitor, forming a memory cell of the DRAM device. A large number of memory cells make up the cell arrays which combine with the peripheral circuit to construct DRAMs.

In recent years, the sizes of the MOSFETs and capacitors have become continuously smaller so that the packing densities of these DRAM devices have increased considerable. For example, a number of semiconductor manufacturing companies in the world have already begun mass production of 64 M bit or even 256 M bit DRAMs.

There are two types of the capacitors currently used for DRAM applications: stack capacitors and trench capacitors. As the sizes of the capacitors become smaller, so as the capacitance values of the capacitors are decreasing, that reduces the signal to noise ratio of the DRAM circuits, causing performance and reliability problems. The issue of maintaining or even increasing the surface area of the storage nodes or reducing the thickness of the dielectric layer is particularly important as the density of the DRAM arrays continues to increase for future generations of memory devices. When fabricating capacitors used for 16 Mbit DRAMs and beyond, increasing stack capacitor surface area becomes a top priority. Various shapes of stack capacitor structures have been used to address this issue. U.S. Pat. No. 5,185,282 to Lee et al. (the entire disclosure of which is herein incorporated by reference) provides a method of fabricating cup-shaped capacitor storage node. Another U.S. Pat. No. 5,021,357 to Taguchi et al. (the entire disclosure of which is herein incorporated by reference) supplies a method of fabricating fin structure capacitor electrode. These stack capacitor structures can effectively increase the capacitance values of the capacitors, however their manufacturing processes are too complicated and highly fastidious. They are difficult to be practically employed for mass-production. Most recently, H. Watanabe et al. in the paper "A new cylindrical capacitor using hemispherical grained Si (HSG-Si) for 256 Mb DRAMs" IEDM 92, pp. 259–262 (the entire disclosure of which is herein incorporated by reference) discloses a method of fabricating cylindrical stack capacitor electrode.

However, due to the already high density of the existing semiconductor devices little room is available for stack capacitors. Moreover, due to the high device density and minimum feature size it is necessary for processing sequences to be compatible with an ever increasing range of structures and materials. Therefore, trench capacitors with buried strap become a better choice for high density DRAM applications. U.S. Pat. No. 5,395,786 to Louis Hsu et al. of IBM and U.S. Pat. No. 4,694,561 to Lebowitz et al. of AT&T (the entire disclosures of which are herein incorporated by reference) both provide a method of fabricating trench capacitors. The trench capacitor structure has a major portion of its plates extending into rather than along the surface of a chip. The amount of the surface area required per capacitor is only the area of the trench at the surface of the chip that allows more densely packed DRAM arrays.

Referring now more particularly to FIG. 1, there are sown a typical trench capacitor processing sequences. First, an oxide layer 12 and a nitride layer 14 are continuously formed on a silicon substrate 10. The oxide layer 12 and nitride layer 14 layers are then partially etched to open a process window for forming a trench by conventional lithography and plasma-etching techniques. Then, the exposed silicon substrate is also etched to form a as shown in FIG. 1A. Next, an oxide/nitride/oxide (ONO) capacitor dielectric layer 18 is deposited inside the trench. A first polysilicon layer 20 as storage node is then deposited to fill the bottom of the trench. Thereafter, dielectric collars 22 are formed on the interior sidewalls of the trench as shown in FIG. 1A. A second polysilicon layer 24 is next deposited inside the trench and aligned with the dielectric collars as shown in FIG. 1B. Next, the second polysilicon is chemical mechanical polished or etchback to form a second polysilicon stud 24a inside the trench. The dielectric collars 22a are then recessed to expose the contact area for the capacitor as shown in FIG. 1C. Next, a third polysilicon layer 26 is deposited and polished overlaying the second polysilicon stud as shown in FIG. 1D. Finally, the third polysilicon layer 26a is etchback to a height slightly lower than the substrate surface to complete the trench capacitor formation.

There are some drawbacks for the conventional trench capacitor fabricating process:

1. The process sequences are complicated and tedious. It needs three polysilicon depositions and two CMP polishings to form a trench capacitor that increases the possibility of wafer contamination.
2. It is also a time consuming process that increases the production cost as well.

Therefore, the present invention discloses an easy and manufacturable method to fabricate trench capacitors for high density DRAM applications.

SUMMARY OF THE INVENTION

According, it is a primary object of the present invention to provide an easy and manufacturable method to fabricate trench capacitors for high density DRAM applications.

It is another object of the present invention to provide a method of fabricating a trench capacitor structure that substitutes second polysilicon with sacrificial materials to save both manufacture time and cost.

It is yet another object of the present invention to provide a method of fabricating a trench capacitor structure with less processing sequences.

It is a further object of the present invention to provide a method of fabricating a trench capacitor structure to reduce the possibility of wafer contamination, and therefore improves the yield and performance of DRAMs.

These objects are accomplished by the fabrication process described below.

First, an oxide layer and a nitride layer are continuously formed on a silicon substrate. The oxide layer and nitride layer layers are partially etched to open a process window for forming a trench by conventional lithography and plasma-etching techniques. Then, the exposed silicon substrate is also etched to form a trench. Next, an ONO capacitor dielectric layer is deposited inside the trench. A first polysilicon layer as storage node is then deposited to fill the bottom of the trench. Thereafter, dielectric collars are formed on the sidewalls of the trench.

Next, a sacrificial stud is formed inside the trench between dielectric collars and first polysilicon. This step is the key point of the present invention, the sacrificial stud can be easily removed by wet etching followed subsequent collar recessing that can eliminate tedious second polysilicon deposition and polishing steps as the prior art would. The sacrificial material must have the properties of both high plasma etching resistance and easy wet stripping from the substrate. The dielectric collars are then recessed to expose the contact area between the trench capacitor and access transistor.

Thereafter, the sacrificial stud is removed, followed by a second polysilicon deposition overlaying the first polysilicon. Finally, the second polysilicon layer is etchback to a height slightly lower than the substrate surface to complete the trench capacitor formation. The second polysilicon layer electrically contacts with the drain. The trench capacitor with buried strap according to the present invention is accomplished.

BRIEF DESCRIPTION OF THE DRAWINGS

The accompanying drawings forming a material part of this description, in which.

DESCRIPTION OF THE PREFERRED EMBODIMENT

Figure 1:
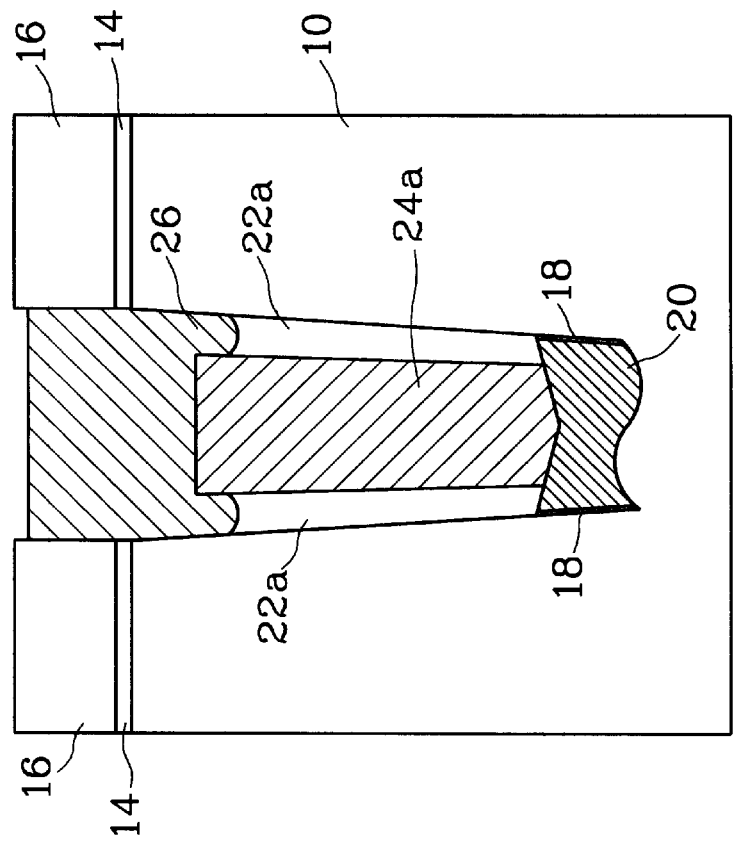
FIGS. 1A to 1E schematically illustrate he process sequences of a trench capacitor according to the prior art.
Figure 1:
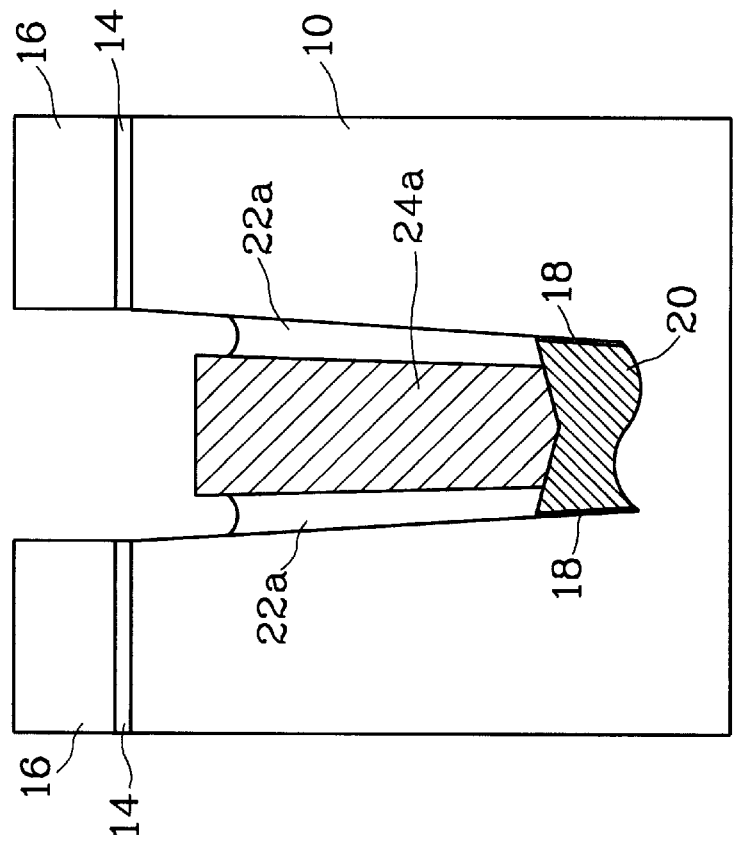

The invention disclosed herein is directed to a method of fabricating the deep trench capacitors of DRAMs. The drawing figures are illustrated a partially completed integrated circuit device. In the following description, numerous details are set forth in order to provide a thorough understanding of the present invention. It will be appreciated by one skilled in the art that variations of these specific details are possible while still achieving the results of the present invention. In other instance, well-known processing steps are not described in detail in order not unnecessarily to obscure the present invention.

Figure 2:
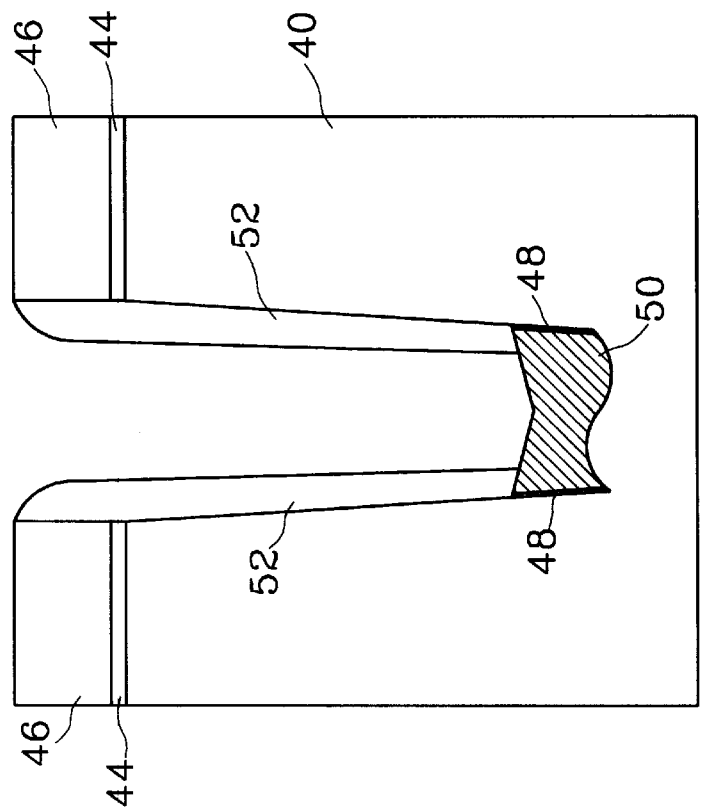
FIGS. 2A to 2E schematically illustrate the process sequences of a trench capacitor according to the present invention.
Figure 1:
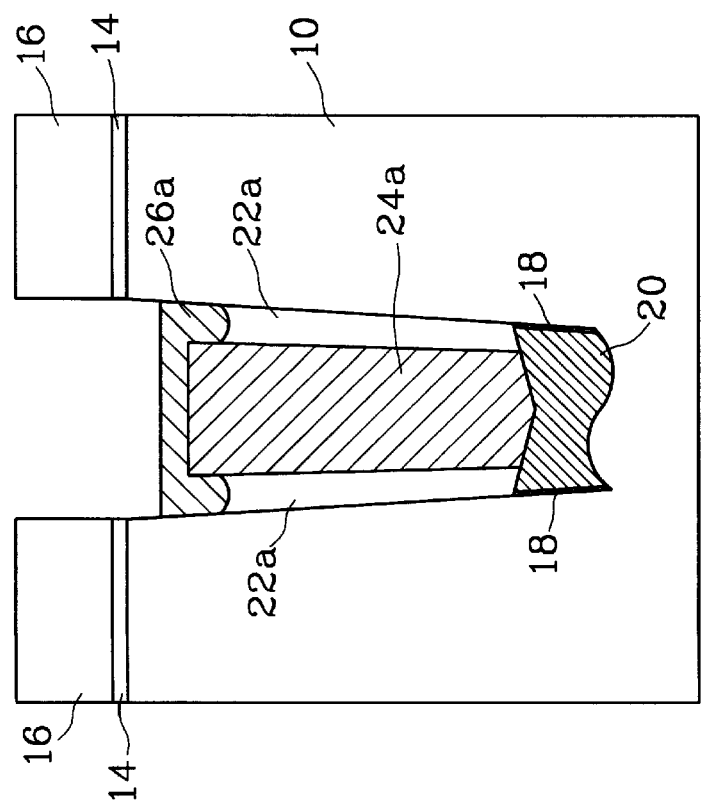
Figure 2:
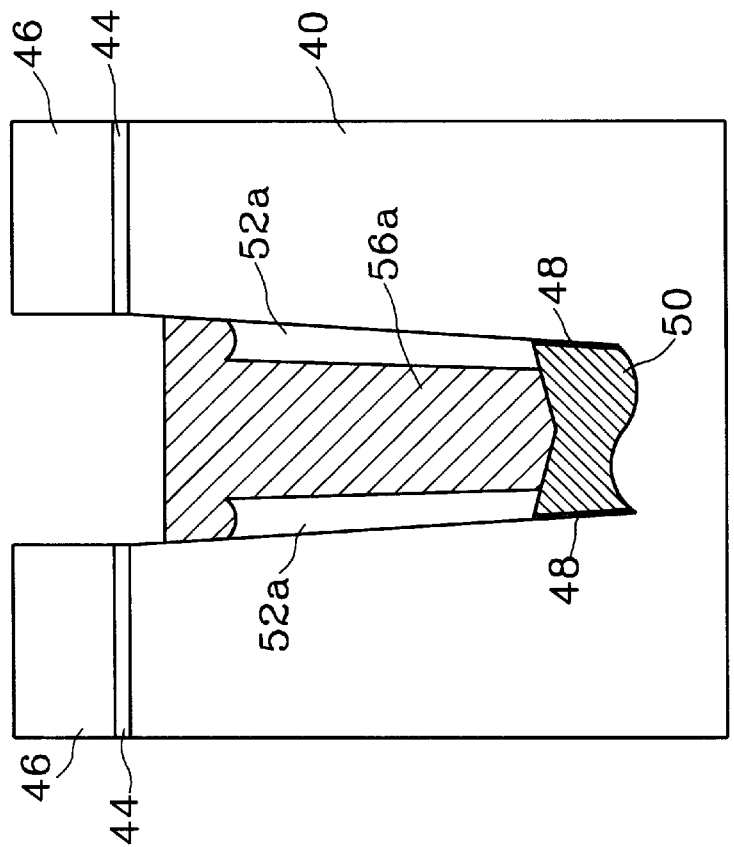
Figure 2:
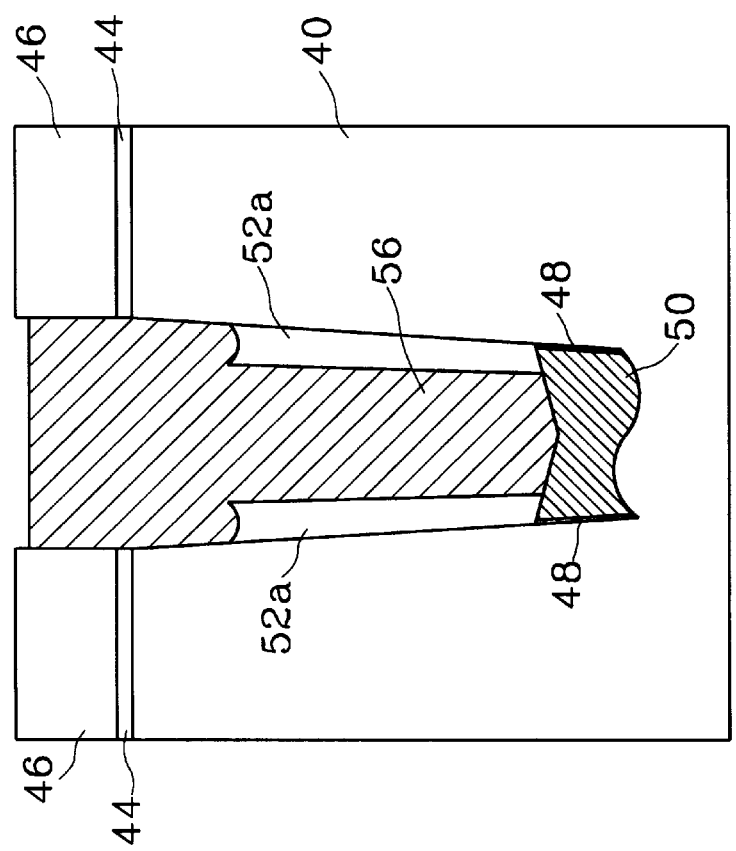

Referring now more particularly to FIGS. 2, there are shown the initial process sequences of the present invention, in which a trench capacitor is fabricated on a P-type semiconductor silicon substrate 40.

Referring to FIG. 2A, an oxide layer 42 and a nitride layer 44 are continuously deposited on the silicon substrate 40. The oxide layer 42 and nitride layer 44 layers are partially etched to open a process window for forming a trench by conventional lithography and plasma-etching techniques. Then, the exposed silicon substrate is also etched to form a trench as shown in FIG. 2A Next, a capacitor dielectric layer 48 is deposited inside the trench. A first polysilicon layer 50 as storage node is then deposited to fill the bottom of the trench. Thereafter, dielectric collars 52 are formed on the interior sidewalls of the trench as shown in FIG. 2A.

The silicon substrate etching step is usually via plasma etching, for example: magnetic enhanced reactive ion etching (MERIE), electron cyclotron etching (ECR) or reactive ion etching (RIE) methods with reactant gases such as $CF_4$ $CHF_3$ and Ar. The capacitor dielectric layer 48 is usually using oxide/nitride/oxide (ONO) triplelayer or even tantalum oxide ($Ta_2O_5$) high dielectric constant materials. The equivalent oxide thickness of the capacitor dielectric layer 48 is about 20 to 150 Angstroms.

The first polysilicon layer 50 is usually formed by in-situ phosphorus doped LPCVD under a mixture of ($15\%PH_3$+$85\%SiH_4$) and ($5\%PH_3$+$95\%N_2$), at the temperature about 550° C. to obtain a thickness of between 1000 to 4000 Angstroms. The dielectric collars 52 are usually made of chemical vapor deposited Tetra-Ethyl-Ortho Silicate (TEOS), alternatively other types of oxide, nitride or even oxynitride may also work. The recessing walls of the dielectric collars are formed by an anisotropic etch.

Referring now to FIG. 2B, a sacrificial stud 54 is formed inside the trench. This step is the key point of the present invention, the sacrificial stud can be easily removed by wet etching followed subsequent caller recess that can omit second polysilicon deposition and polishing steps as the prior art would. The sacrificial material must have the properties of both high plasma etching resistance and easy wet stripping from the substrate. For example, photoresist or organic bottom anti-reflective coating (BARC) materials such as ethyl lactate polymer can be employed.

Referring now to FIG. 2C, dielectric collars 52a are recessed to expose the contact area for the trench capacitor and access transistor as shown in FIG. 2C. This dielectric collars recessing step still performed by anisotropic etch as described before.

Referring now to FIGS. 2D and 2E, first, the sacrificial stud is removed by wet etching, followed by a second polysilicon 56 deposition overlaying the first polysilicon 50 as shown in FIG. 2D. Finally, the second polysilicon layer 56a is etchback to a height slightly lower than the substrate surface to complete the trench capacitor formation as shown in FIG. 2E. The second polysilicon layer 56a electrically contacts with the drain of the access transistor. The trench capacitor with buried strap according to the present invention is accomplished. The sacrificial stud removal process is usually performed by a mixture of sulfuric acid ($H_2SO_4$) and hydrogen peroxide ($H_2O_2$) solutions.

Figure 3:
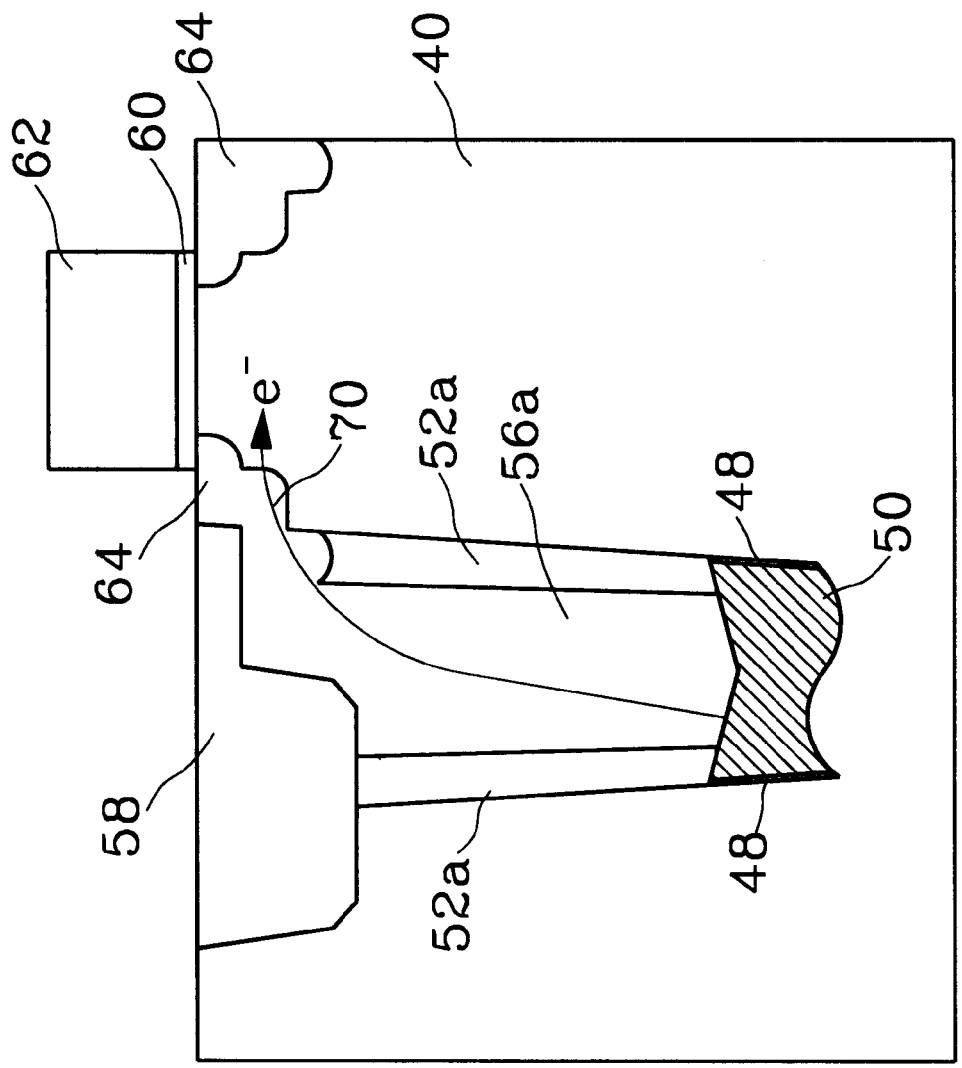
FIG. 3 is a cross sectional representation of a DRAM cell after the final transistor structure is completed.

Referring now to FIG. 3, following trench capacitor formation, isolation region 58 and the access transistor consisting of gate oxide 60, gate 62, and source/drain 64 are formed to finish DRAM formation. The charges are flown through a path 70 between the trench capacitor and access transistor to be charge or discharge the capacitor, that is, performing data writing and reading functions of a DRAM cell.

The method for forming deep trench capacitors according to this invention has the following advantages:

1. The conventional process sequences are complicated and tedious. It needs three polysilicon depositions and two CMP polishings to form a trench capacitor. The present invention substitutes second polysilicon with sacrificial materials to save both process steps and production time.
2. Since process sequences as well as production time are reduced, the turn around time for memory IC products is also decreased that is an ultimate goal for semiconducting industry.
3. There are less polysilicon deposition and polishing steps, that decreases the possibility of wafer contamination, and therefore, enhances the yield and performance of DRAMs.

While the invention has been particularly shown and described with reference to a preferred embodiment, it will be understood by those skilled in the art that various changes in form and detail may be made therein without departing from the spirit and scope of the present invention.

What is claimed is:

1. A method of fabricating a deep trench capacitor of a DRAM cell, said method comprising the steps of:
   (a) providing a semiconductor substrate, and then forming an etching protection pattern on said semiconductor substrate;
   (b) etching said semiconductor substrate to form a trench;
   (c) forming a capacitor dielectric layer on lower portions of the sidewalls as well as the bottom surface of said trench;
   (d) forming a first polysilicon layer overlaying said capacitor dielectric layer;
   (e) forming dielectric collars on upper sidewalls of said trench;
   (f) forming a sacrificial stud inside said trench;
   (g) etching said dielectric collars to a surface height lower than that of said sacrificial stud;
   (h) removing said sacrificial stud;
   (i) forming a second polysilicon stud with a surface height lower than the top surface of said trench; and
   (j) forming a field effect transistor on said semiconductor substrate, wherein said second polysilicon stud electrically contacts to a drain of said field effect transistor.

2. The method of claim 1, wherein said dielectric collars are composed of oxide.

3. The method of claim 1, wherein said capacitor dielectric layer is oxide/nitride/oxide (ONO) triplelayer.

4. The method of claim 1, wherein said sacrificial stud is composed of photoresist.

5. The method of claim 1, wherein said sacrificial stud is composed of organic bottom anti-reflective coating (BARC) materials.

6. The method of claim 5, wherein said BARC materials are polymers.

7. The method of claim 1, wherein said removing said sacrificial stud is performed by a mixture of sulfuric acid ($H_2SO_4$) and hydrogen peroxide ($H_2O_2$).

8. A method of fabricating a deep trench capacitor, said method comprising the steps of:
   (a) providing a semiconductor substrate, and then forming an etching protection pattern on said semiconductor substrate;
   (b) etching said semiconductor substrate to form a trench;
   (c) forming a capacitor dielectric layer on lower portions of the sidewalls as well as the bottom surface of said trench;
   (d) forming a first polysilicon layer overlaying said capacitor dielectric layer;
   (e) forming dielectric collars on upper sidewalls of said trench;
   (f) forming a sacrificial stud inside said trench;
   (g) etching said dielectric collars to a surface height lower than that of said sacrificial stud;
   (h) removing said sacrificial stud; and
   (i) forming a second polysilicon stud with a surface height lower than the top surface of said trench.

9. The method of claim 8, wherein said dielectric collars are composed of oxide.

10. The method of claim 8, wherein said capacitor dielectric layer is oxide/nitride/oxide (ONO) triplelayer.

11. The method of claim 8, wherein said sacrificial stud is composed of photoresist.

12. The method of claim 8, wherein said sacrificial stud is composed of organic bottom anti-reflective coating (BARC) materials.

13. The method of claim 12, wherein said BARC materials are polywers.

14. The method of claim 8, wherein said removing said sacrificial stud is performed by a mixture of sulfuric acid ($H_2SO_4$) and hydrogen peroxide ($H_2O_2$).

* * * * *